United States Patent
Bahl

(10) Patent No.: US 7,814,385 B2
(45) Date of Patent: Oct. 12, 2010

(54) SELF PROGRAMMABLE SHARED BIST FOR TESTING MULTIPLE MEMORIES

(75) Inventor: Swapnil Bahl, New Delhi (IN)

(73) Assignee: STMicroelectronics Pvt. Ltd., Uttar Pradesh (IN)

(*) Notice: Subject to any disclaimer, the term of this patent is extended or adjusted under 35 U.S.C. 154(b) by 490 days.

(21) Appl. No.: 11/848,107

(22) Filed: Aug. 30, 2007

(65) Prior Publication Data

US 2008/0059850 A1    Mar. 6, 2008

(30) Foreign Application Priority Data

Aug. 30, 2006    (IN)    .................    1948/DEL/2006

(51) Int. Cl.
*G01R 31/28*    (2006.01)
(52) U.S. Cl. ...................... 714/733; 714/718
(58) Field of Classification Search .............. 714/727, 714/718, 732, 30, 31, 733; 713/500
See application file for complete search history.

(56) References Cited

U.S. PATENT DOCUMENTS

| | | | |
|---|---|---|---|
| 4,903,266 A | | 2/1990 | Hack |
| 5,535,164 A | | 7/1996 | Adams et al. |
| 5,606,567 A | * | 2/1997 | Agrawal et al. ............. 714/732 |
| 5,617,531 A | | 4/1997 | Crouch et al. |
| 5,796,993 A | * | 8/1998 | Maguire ..................... 713/500 |
| 6,321,320 B1 | | 11/2001 | Fleischman et al. |
| 6,760,865 B2 | * | 7/2004 | Ledford et al. ................ 714/30 |
| 7,168,005 B2 | * | 1/2007 | Adams et al. ................. 714/31 |
| 7,313,739 B2 | * | 12/2007 | Menon et al. ............... 714/718 |
| 2008/0104466 A1 | * | 5/2008 | Menon et al. ............... 714/727 |
| 2008/0126892 A1 | * | 5/2008 | Dubey et al. ................ 714/718 |

* cited by examiner

*Primary Examiner*—David Ton
(74) *Attorney, Agent, or Firm*—Lisa K. Jorgenson; Jeremiah J. Baunach; Seed IP Law Group PLLC

(57) ABSTRACT

A built-in self-test (BIST) device tests multiple embedded memories of different characteristics. The BIST includes a BIST controller, a delay generator, multiple interface modules, and a memory wrapper. The BIST controller generates an initialization sequence and a memory test algorithm. The delay generator provides a delay of an expected data, a valid signal, a BBAD signal, a BEND signal, and a BFAIL signal. The multiple interface modules provide signal pipelining for multiple memories through a bus. The bus carries signals form the BIST device to multiple memories and vice-versa. The memory wrapper decodes a selected memory for decompressing a memory data signal generated by said BIST device and further compresses a memory output signal.

17 Claims, 5 Drawing Sheets

SELF PROGRAMMABLE SHARED BIST FOR TESTING MULTIPLE MEMORIES

CROSS-REFERENCE TO RELATED APPLICATION

This application claims priority from Indian Patent Application No. 1948/Del/2006, filed on Aug. 30, 2006, which is incorporated herein by reference in its entirety.

BACKGROUND

1. Technical Field

The present invention relates to chip testing circuits, and more specifically to a shared built in self testing (BIST) device for testing multiple memories of various characteristics, such as various addressable sizes, various operating speeds, and various data widths.

2. Description of the Related Art

Technological advancements have made it possible to integrate more and more components, even a complete system, into a single chip, called system-on-chip (SOC). Embedded memories are the most common cores in SOC design and are considered to be the vital microelectronic components of a digital logic system.

Several conventional methods are available for testing integrated memory blocks. One conventional method available is to pin out either directly or through multiplexers, the address, control and data pins of the memory. However, the pin count required to test a device by this method can be larger than the number of pins available. Also, for each memory multiplexed, additional logic will have to be introduced, which results in a slower input/output propagation time, which in turn can affect the performance.

Thus, testing embedded memories is a challenge, since testing memory cores is much more difficult than testing commodity memories due to the limitation in available pins that can be used to access the cores.

Another conventional method is the self test method. A self test refers to the presence of testing circuits on a component containing the circuits to be tested. The self test can be accomplished with testing circuits integrated into the circuits to be tested, known as the on-chip testing method, or with the testing circuits located externally on the component, known as the off-chip testing method. On-chip testing is faster as compared to off-chip testing because of the closeness to the circuits being tested.

A conventional self test method is the use of Built-In-Self-Test (BIST) circuits for testing integrated memories. A BIST controller is used to automatically verify functionality of individual blocks of memory. The BIST is considered a good alternative solution to expensive memory testers. The BIST not only provides at-speed testing of memory cores but also decreases the test pattern development time as fewer test patterns are required.

However, BIST technology consumes larger area. BIST consumes 4% to 8% area of the memory and this can increase to more than 150% for smaller memories. The area of the BIST increases with algorithm length and complexity.

FIG. 1 illustrates a conventional BIST method, wherein, each memory instance has a dedicated BIST to test it. So, for a chip containing 70% of area as memory, dedicated BISTs can occupy an unacceptable amount of valuable chip area.

BIST have been shared between memories of same words and bits but these memories should be present in close proximity in the chip. If the memories are working at high frequencies, then testing memories at-speed with a shared BIST becomes impossible.

U.S. Pat. No. 4,903,266 discloses a system and method for on chip self testing of a memory circuit. In this method, the testing is done by using a random pattern generator based upon a primitive polynomial and including a linear feedback shift register having at least one stage in addition to the number of address lines required for addressing the memory. The random pattern generator is capable of cycling through all memory addresses. During each random pattern generator cycles, known data is written or read out of each memory cell. By this method, both possible states of each memory cell can be tested as means for writing and reading the complement of a data during random pattern generator cycles are included. The output is routed to a multiple input signature register and a data signature is generated. The data signature is compared with an expected data signature. This method also provides for a logic circuit testing using a known level sensitive scan design technique. The test output data is provided to a multiple input signature register. A single data signature is then generated, which is indicative of a good or a bad status of both the logic and memory circuits.

U.S. Pat. No. 5,535,164 discloses a system and method for testing a multiplicity of memories of different sizes, types and characteristics using a single built in self test (BIST). The system uses a state machine to select and generate all patterns required for testing all the memories on the chip and impressing all the data, including expected data and the address information on all of the memories simultaneously. The BIST generates unique control signals for various memories and impresses the control signals on the various memories. The BIST selectively asserts the various control signals to write data and to read and capture failure information only to or from those memories, whose unique control signals are asserted. The control signals instruct those memories that do not use particular sequence of inputs or any portion of a given sequence of inputs to ignore such signals, thereby generating the necessary signals to form the test patterns for each and every memory, the data and address information for those patterns, the control signals to write and read each memory and capture error information for that particular memory.

U.S. Pat. No. 5,617,531 discloses a method for internally testing a plurality of embedded memories of a data processor. In this method a data processor has a single test controller. The test controller has a test pattern generator and a memory verification element. The test pattern generated by the test pattern generator is transmitted through a data bus of the data processor to each embedded memory of the plurality of embedded memories through a second storage device. A data read for the plurality of embedded memories is stored in a first storage device. The data from the first storage device is selectively accessed by the memory verification element through the bus. A bit or more than one bit is used to determine whether the memories are operating in an error free manner.

U.S. Pat. No. 6,321,320 discloses a system and method for at-speed access, testing, characterization and monitoring of on-chip memory arrays using a BIST engine independent of other chip circuitry. Each BIST engine consists of a mail control block, one address generation block having an address local control block and one or more address data generation blocks and one data generation block having a data local control block and one or more data generation blocks. The local address and data control blocks are programmed independently to define operations that will be performed by the individual address and data generation blocks. The main control block controls the operation of the local address and the data control blocks to provide desired testing, accessing and monitoring of the on-chip memory arrays.

The conventional methods and systems as discussed above do not overcome all the existing problems encountered in the field of chip testing like, requirement of a larger area, inability to test memories at-speed with a shared BIST, inability of a shared BIST in testing memories placed relatively far in the chip, etc.

BRIEF SUMMARY

One embodiment is a novel on-chip testing mechanism, which can provide a shared BIST device for testing various memories present on the chip. The novel mechanism is self programmable in terms of pipeline stage calculations and can be used to test memories at-speed, irrespective of their placement on the chip. The mechanism can be used to test memories of different sizes using a single BIST.

One embodiment provides a shared built in self testing (BIST) device for testing at-speed multiple memories, irrespective of their placement on a chip.

One embodiment provides a shared built-in self-test (BIST) device for testing a plurality of memories of one or more characteristics, said testing device comprising:

a BIST controller for generating an initialization sequence and a memory test algorithm;

a delay generator for delaying an expected data, a valid signal, a BIST BAD (BBAD) signal, a BIST END (BEND) signal, and a BIST FAIL (BFAIL) signal;

a plurality of interface modules for pipelining of signals for the plurality of memories through a bus, said bus carrying said signals form the BIST device to the plurality of memories and from the plurality of memories to the BIST device; and a memory wrapper decoding a selected memory for decompressing a memory data signal generated by said BIST device and for compressing a memory output signal.

One embodiment provides a method for testing a plurality of memories through a BIST device comprising the steps of:

generating an initialization sequence through a BIST controller;

delaying an expected data, a valid signal, a BIST BAD (BBAD) signal, a BIST END (BEND) signal, and a BIST FAIL (BFAIL) signal through a delay generator; and running a test algorithm for testing the plurality of memories.

BRIEF DESCRIPTION OF THE SEVERAL VIEWS OF THE DRAWINGS

The present invention is described with the help of accompanying drawings.

DETAILED DESCRIPTION

Figure 1:
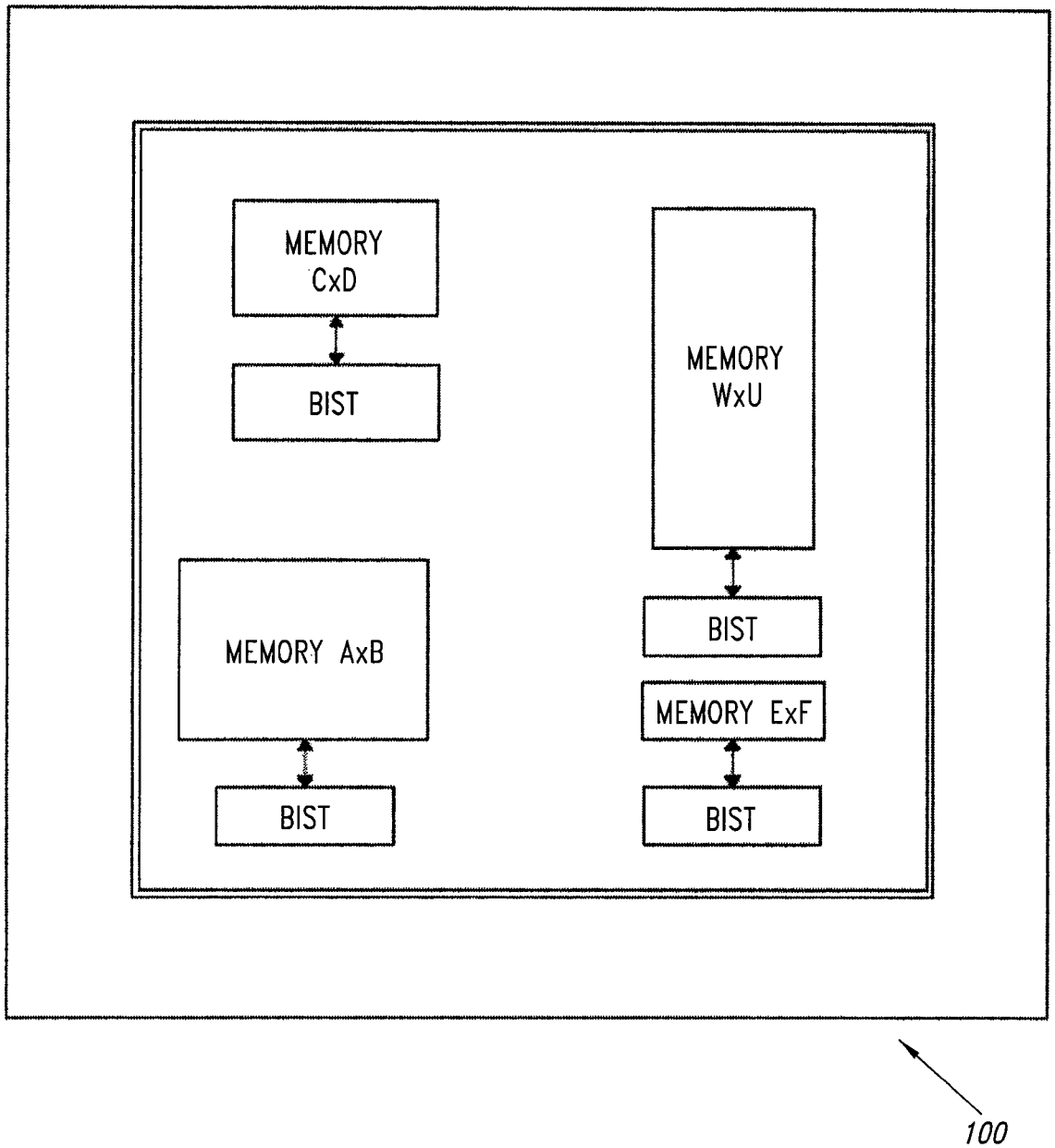
FIG. 1 illustrates a block diagram of a conventional chip having a dedicated BIST for each memory.

The preferred embodiments of the present invention will be described in detail with reference to the accompanying drawings. However, the present invention is not limited to the preferred embodiments. The present invention can be modified in various forms. The preferred embodiments of the present invention are only provided to explain more clearly the present invention to the ordinarily skilled in the art of the present invention. In the accompanying drawings, like reference numerals are used to indicate like components.

One embodiment provides a shared built in self testing (BIST) device for testing at-speed multiple memories, irrespective of their placement on a chip. The shared BIST is self programmable in terms of pipelined stage calculations used to test memories at-speed.

Figure 2:
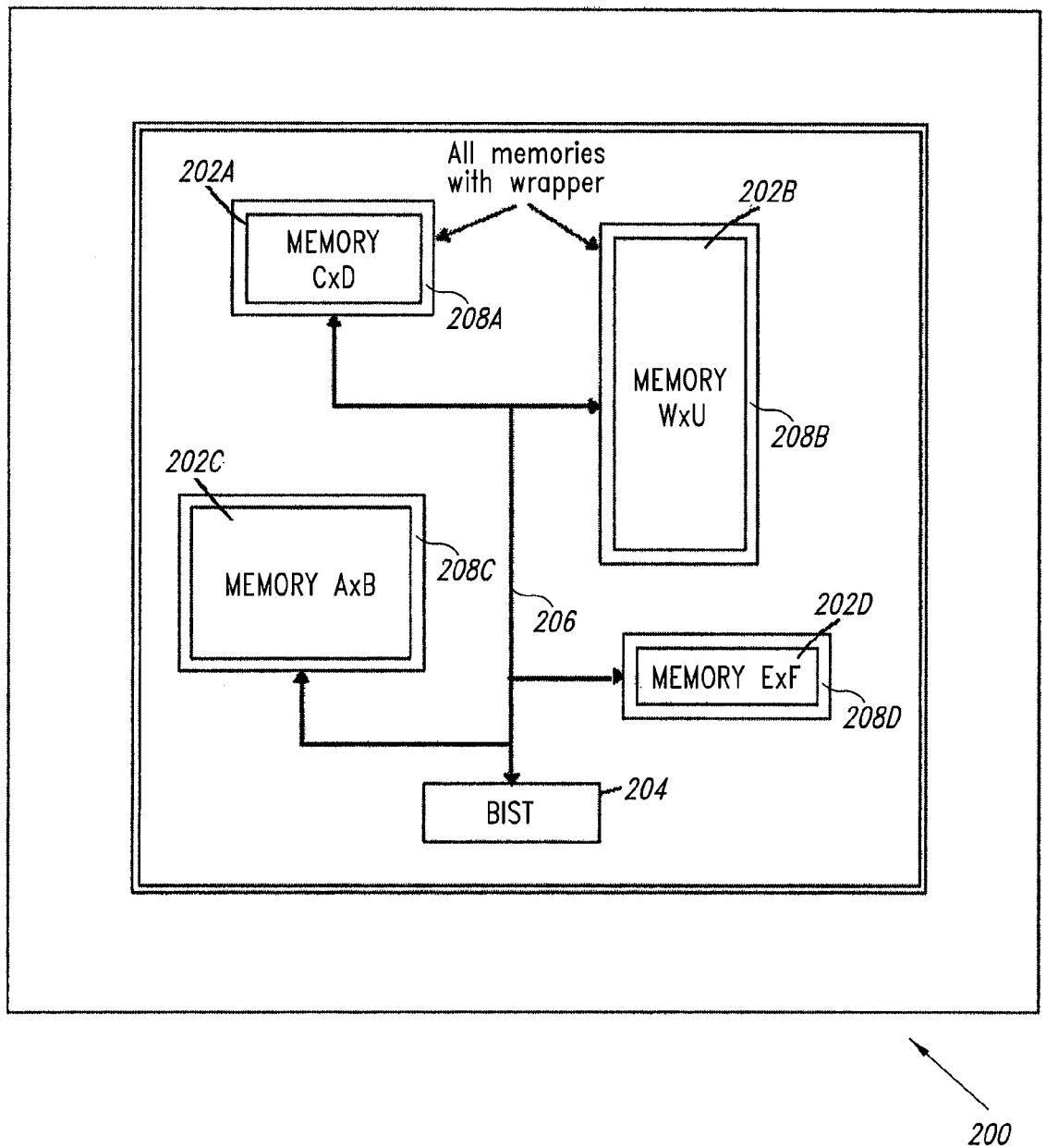
FIG. 2 illustrates a block diagram of a device having multiple memories with a shared BIST and localized wrapper according to one embodiment.

FIG. 2 illustrates a block diagram of a chip 200 having multiple memories, such as, 202A, 202B, 202C and 202D, of different size, sharing a common BIST controller 204 via a bus 206. The memories 202A, 202B, 202C and 202D are surrounded respectively by wrappers 208A, 208B, 208C, 208D. The wrappers include a data generator block, an output compacter, a cut selection decoder and transparent mode multiplexers. The BIST controller 204 is a central block and is designed for generating the operations according to a predefined algorithm. The data compression takes place in the centralized BIST controller 204. The data decompression and memory output compression takes place in the wrappers. The wrappers are memory width (bits) dependent, but the central BIST controller 204 is memory independent. The cut selection decoder is for decoding the memory selected for testing. Transparent mode multiplexers are for selecting between functional signals and BIST signals.

All the pattern based memory test algorithms contain a data background as either all 0's or all 1's or 0101 . . . 01 or 1010 . . . 10 patterns. This information does not require more than 2 data bits to be compacted. Similarly, the memory output does not require more than 4 data bits to be compacted (by doing AND and OR operations on even and odd bits). The wrapper decodes the 2 data bits from the BIST controller 204 and compresses the memory output into 4 bits for the BIST controller 204. The information sent by the BIST to the memories 202A-D via the bus 206 includes address (# add_width), data (#2 bits), csn (i.e., chip select; #1 bit), wen (i.e., write enable; #1 bit) and cut_sel (# log 2 (No_of_cuts)). The memories each send the BIST 4 bits containing the compacted output of the memory.

Figure 3:
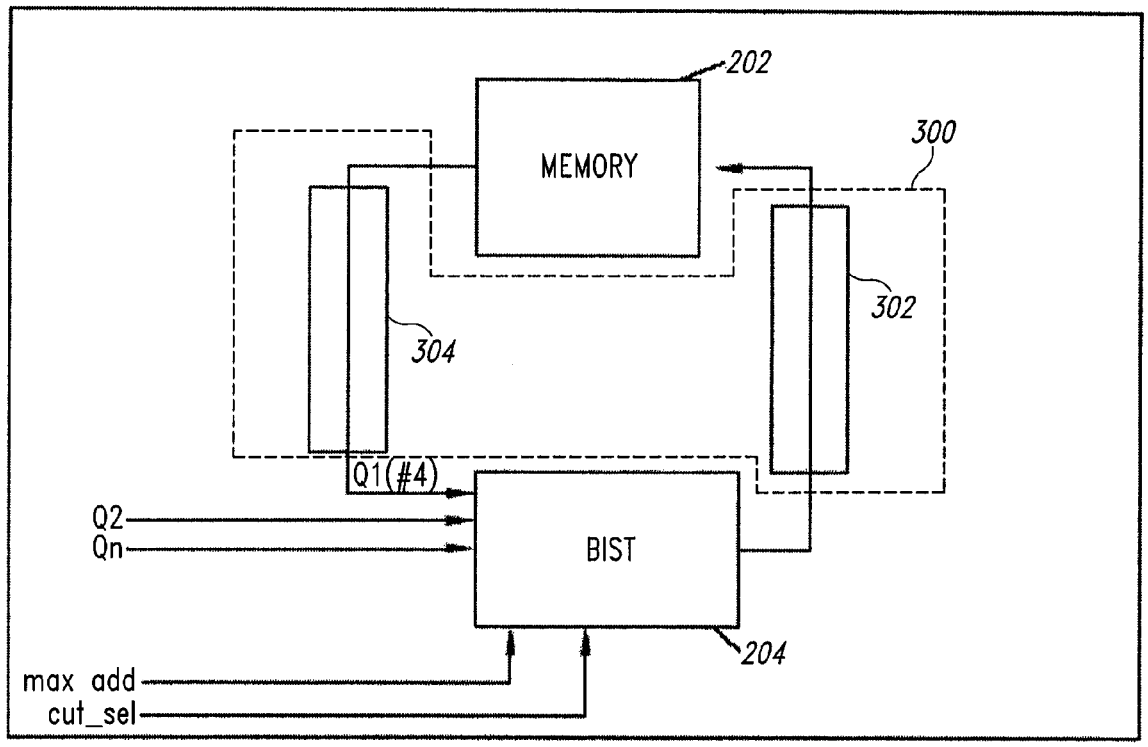
FIG. 3 illustrates a block diagram of a memory BIST interface module according one embodiment.

FIG. 3 illustrates a block diagram of an interface module 300 between a memory 202 (such as any of the memories 202A, 202B, 202C and 202D and the BIST controller 204. Although FIG. 3 shows only one interface module 300, the BIST system includes plural such interface module respectively coupled between the memories 202A, 202B, 202C and 202D and the BIST controller 204. The interface module 300 includes a BIST_to_mem bus 302 that conveys data from the BIST controller 204 to the memory 202 and a mem_to_BIST_$cut bus 304 that conveys data from the memory 202 to the BIST controller 204. Each of the buses 302, 304 includes a number of flip-flops that is different for each of the memories on the chip according to the placement of the memories on the chip. The buses 302, 304 could be implemented using separate physical buses or a single two-way bus. In addition, the buses 302, 304 could be implemented using part of the bus 206 shown in FIG. 2 or could be implemented between the respective memories 202A, 202B, 202C and 202D and the bus 206.

A finite state machine (FSM) in the BIST controller 204 is modified to run a sequence of operations before running the actual test algorithm. In the initial sequence, the BIST 204 generates a transition from 0 to 1 and passes it through the BIST_to_mem bus 302 and the mem_to_BIST_$cut bus 304 and waits for the transition to reach back to the BIST controller 204, for calculating the total number of flip flops put along this path. During this sequence, the memory 202 would be in a bypass mode, i.e., a data would be mapped on Q bits inside the wrapper. The BIST controller 204 waits for a predefined number of clock cycles for the transition to re-appear at the mem_to_BIST_$cut bus. This calculated delay value is then used to delay the internal signals. Thus, the data comparison of 'expected' and 'obtained' output can be delayed using the calculated delay value during the run time. Also signals, such as a BIST END (BEND), a BIST FAIL (BFAIL) and a BIST BAD (BBAD) called as status flags can be delayed by an amount depending on the calculated delay value. If the transition does not reappear, the status flag BIST BAD (BBAD), points that there is some kind of fault in the path and BIST cannot be used for testing that particular memory.

The BIST_to_mem bus 302 carries the BIST signals to the memory. This bus is different from a conventional BIST to memory signal bus. The signals are pipelined in the BIST_to_mem bus using flip flops depending upon the speed of testing and the total delay in the path. For any memory all the signals are pipelined by the same number of clock cycles. These pipelining flip flops are positioned during the placement and routing steps. Different memories will have different number of pipelining flip flops depending upon its placement in the chip and the speed of testing. Similarly, the mem_to_BIST_$cut bus 304 is also pipelined. Flip flops are placed so that the timing equations, i.e., setup and hold equations are satisfied. Thus, the delay between two flip flops is less than time_period–propagation_delay (first_flip flop)–setup_time (2 flip flops).

Figure 4:
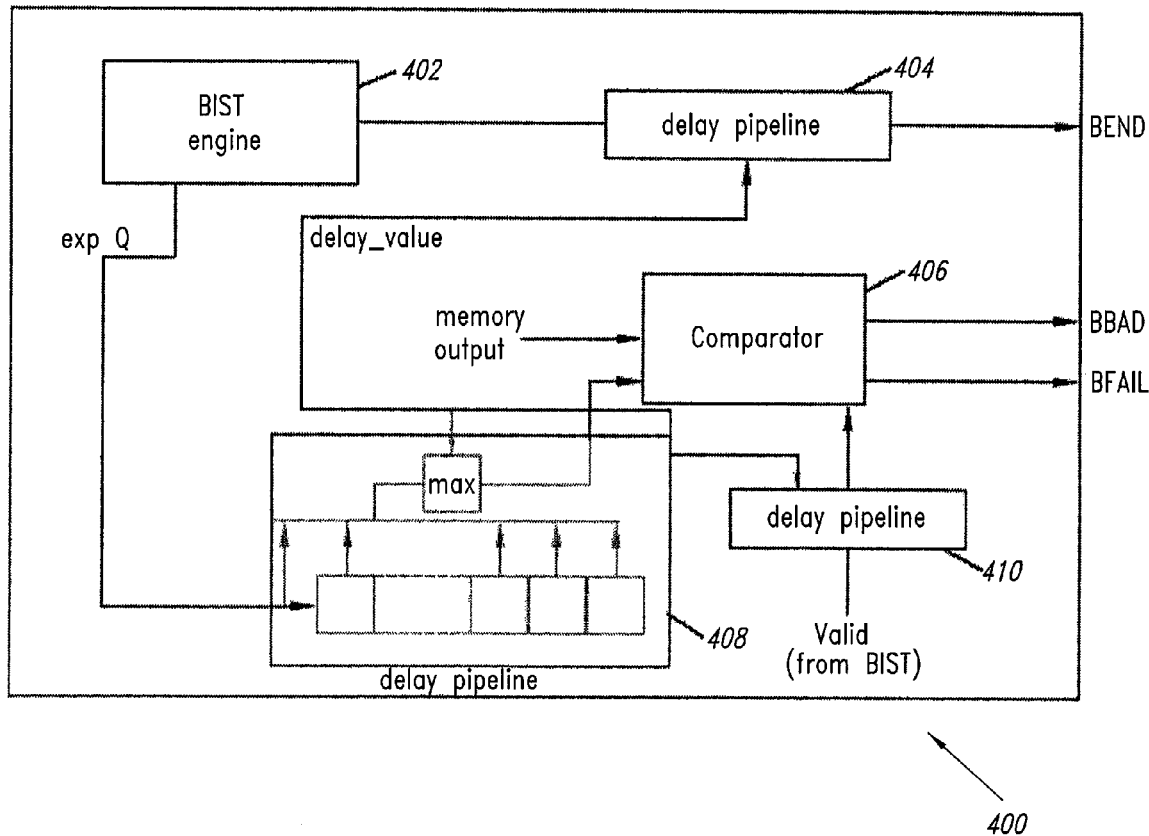
FIG. 4 illustrates a block diagram of a pipelining insertion inside a BIST according to one embodiment.

FIG. 4 illustrates a block diagram 400 of a pipelining system 400 inside the BIST controller 204, according to one embodiment. The BIST controller 204 includes a BIST engine 402, multiple delay pipelines, such as 404, 408, 410 and a comparator block 406. The BIST is modified by adding programmable delay pipelines inside the BIST controller. The two extra inputs are max_address and cutsel. The Max_address is employed if the memories to be tested are of different number of addresses. The Max_address is m+n bits, where m bits tell a maximum row address and n bits tell a maximum column address of the memory cut to be tested and is selected by 'cutsel' bits. A multiplexer selects the output of the selected memory from the outputs of different memories. The internal generation of expected output (exp Q) is delayed to the comparator block 406 using a programmable delay generator. The value of delay is automatically calculated by the BIST controller 204, as described above, before running the test algorithm. The value of delay is in terms of number of clock cycles. The 'valid' signal, which tells the cycles where the comparison is valid, is also delayed. Similarly the flags BEND, BBAD and BFAIL are also delayed by the same number of clock cycles. The data generator block compresses the data bits in 2 bits. The BIST uses the max_add to know the maximum row and column addresses to be generated.

This method allows a single BIST to test at-speed all memories of different size, different operating speed and different data widths, present on the chip. The max_add tells the maximum row and column address of the memory. The data bits are always compressed in 2 bits and the memory output is always 4 bits, making it independent of memory bits. The BIST controller 204, when enabled, generates a transition on data bus and puts the memory in bypass mode and waits for the transition on the output bus. The BIST controller 204 calculates the total number of pipelined stages of that particular memory and uses this value to delay the expected value and internal flags. The BIST controller then starts the usual operation of generating memory test operations.

Figure 5:
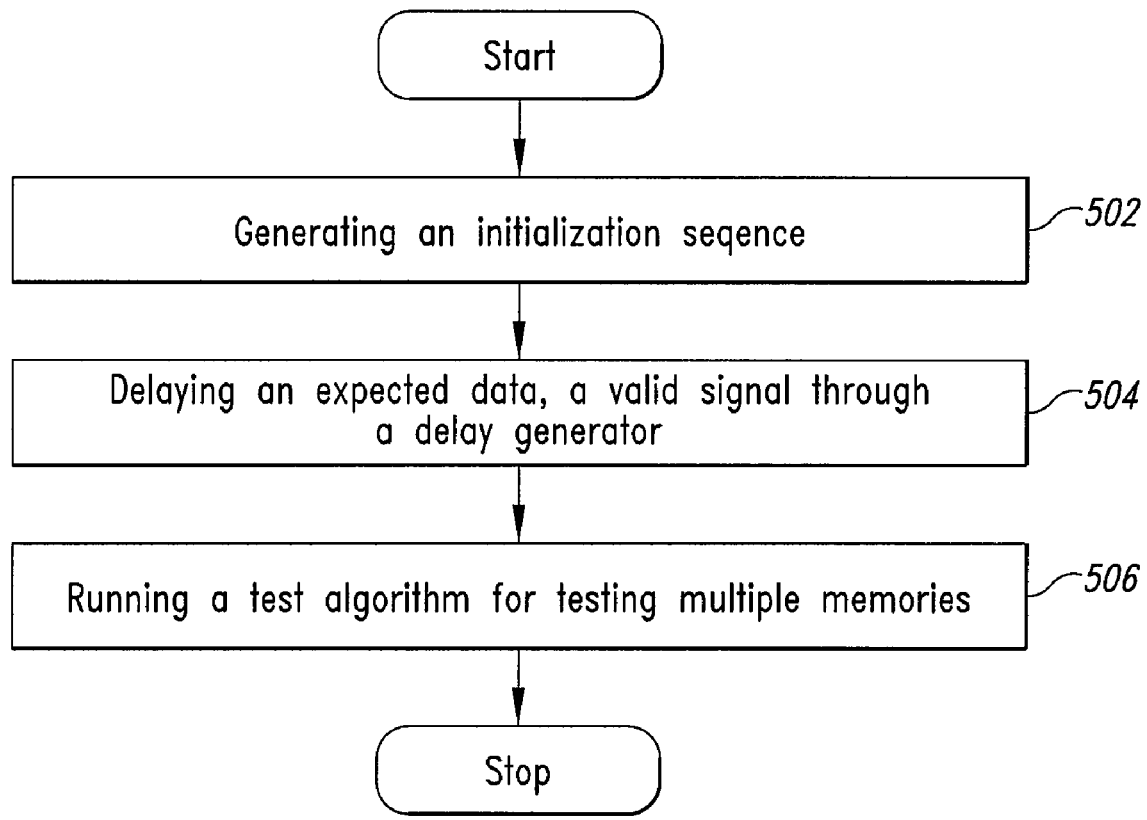
FIG. 5 illustrates a flow diagram of a method for testing multiple memories using a shared built in self testing (BIST) device according to one embodiment.

FIG. 5 illustrates a flow diagram of a method for testing multiple memories using a shared built in self testing (BIST) device. At step 502, an initialization sequence is generated using a BIST controller. At step 504, an expected data, a valid signal, a BBAD signal, a BEND signal and a BFAIL signal are delayed through a delay generator. At step 506, a test algorithm is run for testing multiple memories.

The architecture described above offers many advantages. First, different memories of varying characteristics can be tested by using only a single BIST. Second, all memories on a chip can be tested using a single BIST, irrespective of their placement on the chip. Third, the present method reduces greatly the test logic present on the chip as large number of memories can be tested using a single BIST.

Although the disclosure of system and method has been described in connection with the embodiment of the present invention illustrated in the accompanying drawings, it is not limited thereto. It will be apparent to those skilled in the art that various substitutions, modifications and changes may be made thereto without departing from the scope and spirit of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

I claim:

1. A shared built-in self-test (BIST) device for testing a plurality of memories with one or more characteristics comprising:
    a BIST controller structured to generate an initialization sequence and a memory test algorithm;
    a delay generator structured to delay expected data and internal status signals;
    a plurality of interface modules structured for pipelining of signals for the plurality of memories through a bus, said bus being configured to carry said signals from the BIST device to the plurality of memories and from the plurality of memories to the BIST device; and
    a memory wrapper configured to decompress a memory data signal generated by said BIST device and compress a memory output signal.

2. The device as claimed in claim 1, wherein the one or more characteristics of said memories comprises one or more addressable sizes, one or more operating speeds, and one or more data widths.

3. The device as claimed in claim 1, wherein said delay generator comprises a shift register for generating a delay.

4. The device as claimed in claim 1, wherein said delay generator comprises a programmable delay generator.

5. The device as claimed in claim 1, wherein said BIST controller module is structured to generate a transition sequence for calculating pipeline stages in a BIST memory interface and the memory test algorithm.

6. The device as claimed in claim 1, wherein said interface module is configured to provide the pipelining to keep flip flops on through all the signals as required by timing requirements, said timing requirements depending on a test speed and a memory BIST placement.

7. The device as claimed in claim 1, wherein said internal status signals include a valid signal, a BIST BAD (BBAD) signal, a BIST END (BEND) signal, and a BIST FAIL (BFAIL) signal.

8. The method as claimed in claim 7 further comprising pipelining of signals through a plurality of interface modules.

9. A method of testing a plurality of memories through a BIST device, comprising:
    generating an initialization sequence through a BIST controller coupled to the plurality of memories;
    delaying expected data and internal status signals through a delay generator of the BIST controller; and
    running a test algorithm for testing the plurality of memories including comparing obtained data to the delayed expected data.

10. The method as claimed in claim 9, further comprising decoding a selected memory, decompressing a memory data signal generated by said BIST device, and compressing a memory output signal through a memory wrapper.

11. The method as claimed in claim 9, further comprising:
sending a test signal from the BIST controller to a selected one of the memories and back to the BIST controller; and
calculating a delay based on how long the test signal took to return to the BIST controller, wherein the delaying includes delaying the expected data and internal status signals based on the calculated delay.

12. The method as claimed in claim 9, wherein said internal status signals include a valid signal, a BIST BAD (BBAD) signal, a BIST END (BEND) signal, and a BIST FAIL (BFAIL) signal.

13. A system comprising:
a BIST controller configured to generate an initialization sequence; and
a plurality of memories coupled to the BIST controller, the BIST controller configured to test the plurality of memories by delaying expected data and internal status signals through a delay generator of the BIST controller and by running a test algorithm for testing the plurality of memories comparing obtained data to the delayed expected data.

14. The system as claimed in claim 13, further comprising a memory wrapper coupled to at least one of the plurality of memories configured to decode a selected memory, decompress a memory data signal generated by the BIST controller, and compress a memory output signal.

15. The system as claimed in claim 13 further comprising a plurality of interface modules between the BIST controller and the plurality of memories configured to pipeline of signals from the BIST controller.

16. The system as claimed in claim 13, wherein the BIST controller is further configured to send a test signal from the BIST controller to a selected one of the plurality of memories and receive the test signal back at the BIST controller and calculate a delay based on how long the test signal took to return to the BIST controller, wherein the delaying includes delaying the expected data and internal status signals based on the calculated delay.

17. The system as claimed in claim 13, wherein said internal status signals include a valid signal, a BIST BAD (BBAD) signal, a BIST END (BEND) signal, and a BIST FAIL (BFAIL) signal.

* * * * *